(12) United States Patent
Roy et al.

(10) Patent No.: US 7,111,223 B2
(45) Date of Patent: Sep. 19, 2006

(54) ERROR WORD GENERATION WITH MULTIPLE ELEMENT INPUT

(75) Inventors: Pulakesh Roy, Sunnyvale, CA (US); Tibor Boros, San Francisco, CA (US)

(73) Assignee: Arraycomm, LLC, San Jose, CA (US)

( * ) Notice: Subject to any disclaimer, the term of this patent is extended or adjusted under 35 U.S.C. 154(b) by 231 days.

(21) Appl. No.: 10/402,775

(22) Filed: Mar. 28, 2003

(65) Prior Publication Data

US 2004/0193994 A1 Sep. 30, 2004

(51) Int. Cl.
*H03M 13/00* (2006.01)

(52) U.S. Cl. ............................................ 714/758

(58) Field of Classification Search ........ 714/752–758, 714/781; 708/521; 370/392
See application file for complete search history.

(56) References Cited

U.S. PATENT DOCUMENTS

| | | | |
|---|---|---|---|
| 5,084,891 A | * | 1/1992 | Ariyavisitakul et al. .... 714/775 |
| 5,323,403 A | * | 6/1994 | Elliott ........................ 714/757 |
| 6,810,501 B1 | * | 10/2004 | Ferguson et al. ........... 714/781 |
| 2004/0193993 A1 | | 9/2004 | Roy et al. |
| 2005/0071131 A1 | | 3/2005 | Anderson et al. |
| 2006/0009952 A1 | | 1/2006 | Anderson et al. |

OTHER PUBLICATIONS

Sait et al. 'Hardware design and VLSI implementation of a byte-wise CRC generator chip,'IEEE Transactions on Consumer Electronics, Feb. 1995, pp. 195-200, vol. 41, Issue: 1.*
Sait et al, Feb 1995, pp. 195-200—Hardware Design and VLSI Implementation of a Byte-Wise CRC Generator Chip.
PCT Search Report Dated Feb. 25, 2005.
Williams—A Painless Guide to CRC Error Detection Algorithms—35 pages—Ver 3—Aug. 19, 1993.

* cited by examiner

*Primary Examiner*—Guy J. Lamarre
(74) *Attorney, Agent, or Firm*—Blakely Sokoloff Taylor & Zafman

(57) ABSTRACT

According to an embodiment of the invention, a method and apparatus are described for producing an error word for a data stream. According to an embodiment of the invention, a method includes receiving a plurality of data elements of a data stream; and updating an error word for the data stream by processing the plurality of data elements in a single iteration.

54 Claims, 8 Drawing Sheets

ERROR WORD GENERATION WITH MULTIPLE ELEMENT INPUT

FIELD OF THE INVENTION

The invention relates generally to the field of digital communications. More particularly, the invention relates to error word generation with multiple element input.

DESCRIPTION OF THE RELATED ART

In digital communications, the accuracy of received data is often verified using an error word, such as a cyclic redundancy check (CRC) word. A transmitter uses the information bits in a communication to calculate a reference error word, which generally is transmitted along with the information bits in the same packet or burst. A receiver then calculates the error word again by passing the received information through an identical error word generator. The receiver then generally compares the calculated error word with the received error word, which is usually embedded in the received data stream. Based on the result of the comparison, the receiver determines the accuracy of the received data.

A conventional error word generator may be implemented using a linear feedback shift register (LFSR) structure. However, a LFSR requires as many cycles to generate the output as the length of the input bit-sequence. For example, one thousand cycles are needed to generate an error word for a 1000-bit data sequence. Thus, a conventional system is not capable of processing more than one data element in one cycle or iteration.

In some applications the input data rate to an error word generator can be higher than the operating clock frequency of the generator. This would require that more than one data element be processed in each clock cycle, thereby complicating the operation of the error word generator. Even if the clock rate of an error word generator is sufficient to match the input data rate, high-speed data operations require a very high clock rate for an error word generator, thereby adversely affecting power consumption. In certain other applications, the input to an error word generator may appear as multiple-bit (generally 8-bit, 16-bit, or 32-bit) wide words instead of a bit stream. In a conventional system, another shift register, generally referred to as a serializer, is added to the input of the error word generator to convert the input word to a bit stream. Depending on the application specification, a serializer may have similar hardware complexity as the error word generator itself, thereby greatly complicating the design. Moreover, requiring the operation of an additional shift register for error word generation may cause a significant increase in power consumption.

BRIEF SUMMARY OF THE INVENTION

A method and apparatus are provided for an error word generator that processes multiple data elements in each cycle or iteration. According to an embodiment of the invention, a method comprises receiving a data stream; processing a plurality of elements of the data stream in each of a plurality of iterations; and producing an error word for the data steam based on the processing of the elements of the data stream.

According to an embodiment of the invention, a method comprises receiving a plurality of data elements of a data stream; and updating an error word for the data stream by processing the plurality of data elements in a single iteration.

Other features of the present invention will be apparent from the accompanying drawings and from the detailed description that follows.

BRIEF DESCRIPTION OF THE SEVERAL VIEWS OF THE DRAWINGS

The present invention is illustrated by way of example, and not by way of limitation, in the figures of the accompanying drawings in which like reference numerals refer to similar elements, and in which.

DETAILED DESCRIPTION OF THE INVENTION

Overview

Figure 1:
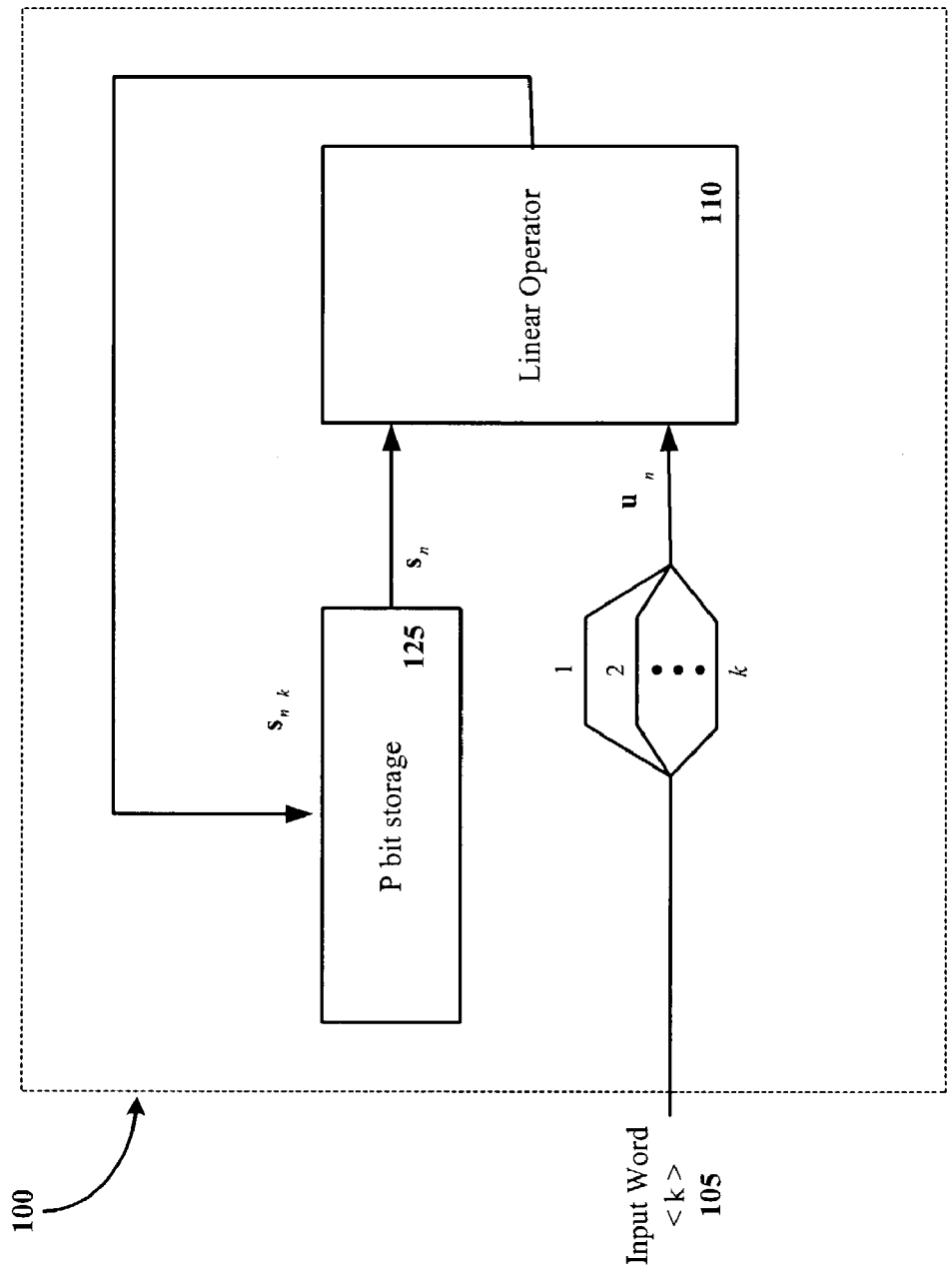
FIG. 1 is an illustration of a error word generator comprising a linear operator according to an embodiment of the invention.

According to an embodiment of the invention, a CRC generator generates a CRC word using a clock rate that is smaller than the input bit rate. The CRC generator processes multiple sequential bits in single cycle or iteration or processes a data word without converting the data word into sequential bits. The CRC generator efficiently processes multiple input bits in every clock cycle, thereby allowing computation of a CRC word even if the clock rate for the CRC generator is slower than the input bit rate. The CRC generator does not require an extra shift register for parallel-to-serial conversion if the input is in word format.

Error Word Generator

According to an embodiment of the invention, an error word generator generates an error word by processing multiple data elements in single cycle or iteration. The error word generator can process a data word without converting the data word into sequential data elements. The error word generator efficiently processes multiple data elements in every clock cycle, thereby allowing computation of an error word even if the clock rate for the error word generator is lower than the input bit rate. The error word generator does not require an extra shift register for parallel-to-serial conversion if the input is in word format.

Under an embodiment of the invention, generation of an error word for a data stream comprises applying a linear operator to a plurality of data elements and a previous state in a single cycle or iteration. Under another embodiment of the invention, updating an error word comprises receiving a plurality of data elements and updating an error word for the data stream by processing the plurality of data elements in a single cycle or iteration. An embodiment of the invention produces the same result for a data stream as would be produced by pushing the data stream serially through a linear feedback shift register. An embodiment of the invention may comprise a cyclic redundancy check (CRC) word generator.

An error word generator according to an embodiment of the invention may be more power efficient than a conventional error word generator. The use of a slower clock in the error word generator generally provides a power savings that is proportional to the reduction in clock speed. Because an embodiment of the invention can update an error word based on multiple data elements in each clock cycle, the clock rate for the error word generator can be reduced to save power while the generator continues to process data at the same rate.

In a particular example, a user terminal modem chip provides a data stream that is 10-bit wide with a sample rate of 18 Msps (mega-samples per second), and thus the input data rate is 180 Mbits/sec. However, the maximum operating frequency of an error word generator is 54 MHz. In this example, a conventional LFSR architecture cannot be used because of the insufficient clock frequency. Under an embodiment of the invention, multiple bits of the data stream are processed in each clock cycle. In the example, processing five bits of input data in each cycle enables the generation of the error word despite the differences in clock rates. In general terms, a data source may generate multiple data elements for every cycle of an error word generator and the data elements are required to be passed sequentially through the error word generator to generate the error word.

The operation of a linear error word generator can be represented using the following state-space equations:

$$s_{n+1} = As_n + bu_n$$
$$y_n = s_n \quad (1)$$

In Equation (1), $s_n$, represents the state and $y_n$, represents the output of the generator at time instant n. A is the state transition matrix of size P×P and b is the input matrix of size P×1, where P is the order of the error word generator. Equation (1) uses only one input and calculates only the immediately following state during each iteration of the process.

Under an embodiment of the invention, the state-space equation for an error word generator is extended to allow multiple data inputs in each cycle or iteration. If the number of inputs to be used is k, then, with the system being started from state $s_n$, the calculated new state will be $s_{n+k}$. A new state-space equation for an error word generator can be derived as follows:

$$\begin{aligned} s_{n+2} &= As_{n+1} + bu_{n+1} \\ &= A(As_n + bu_n) + bu_{n+1} \\ &= A^2 s_n + Abu_n + bu_{n+1} \\ s_{n+3} &= As_{n+2} + bu_{n+2} \\ &= A^3 s_n + A^2 bu_n + Abu_{n+1} + bu_{n+2} \\ &M \\ s_{n+k} &= A^k s_n + A^{k-1} bu_n + \Lambda + Abu_{n+k-2} + bu_{n+k-1} \end{aligned} \quad (2)$$

Equation (2) can then be rewritten by grouping the terms consisting of input bits as follows:

$$s_{n+k} = A^k s_n + [A^{k-1}b \quad A^{k-2}b \quad \Lambda \quad Ab \quad b] \times \begin{bmatrix} u_n \\ u_{n+1} \\ M \\ u_{n+k-2} \\ u_{n+k-1} \end{bmatrix} \quad (3)$$

$$s_{n+k} = R_1 s_n + R_2 u_n = [R_1 \quad R_2] \times \begin{bmatrix} s_n \\ u_n \end{bmatrix}$$

For a binary input data stream, the operations shown in Equations (2) and (3) are all defined over GF(2) (Galois Field (2)). Matrices A and b and any product of such matrixes are constants for a particular error word generator. Using Equation (3), multiple input bits can be used to update the error word generator state in a single clock cycle or iteration. Therefore, under an embodiment of the invention, an error word generator is capable of processing high-speed data while operating with a clock speed that is slower than the input data rate.

For any specific application for an error code generator, the values of k, A and b are fixed. Therefore, any other factor derived from these fixed values will be a constant for the application. In Equation (3), the factor $R_1=A^k$ is a constant matrix of size P×P and the factor $R_2=\lfloor A^{k-1}b \ A^{k-2}b \ \Lambda \ Ab \ b \rfloor$ is a constant matrix of size P×k. A general architecture of error word generator capable of processing multiple bits in each cycle or iteration can be derived from Equation (3). For a particular error word generator, the matrices $R_1$ and $R_2$ can be pre-computed. Under an embodiment of the invention, the error word generator may apply a linear operator that is stored in a ROM (read-only memory) table, is contained in a Boolean function, is provided in software, or is otherwise implemented.

Figure 2:
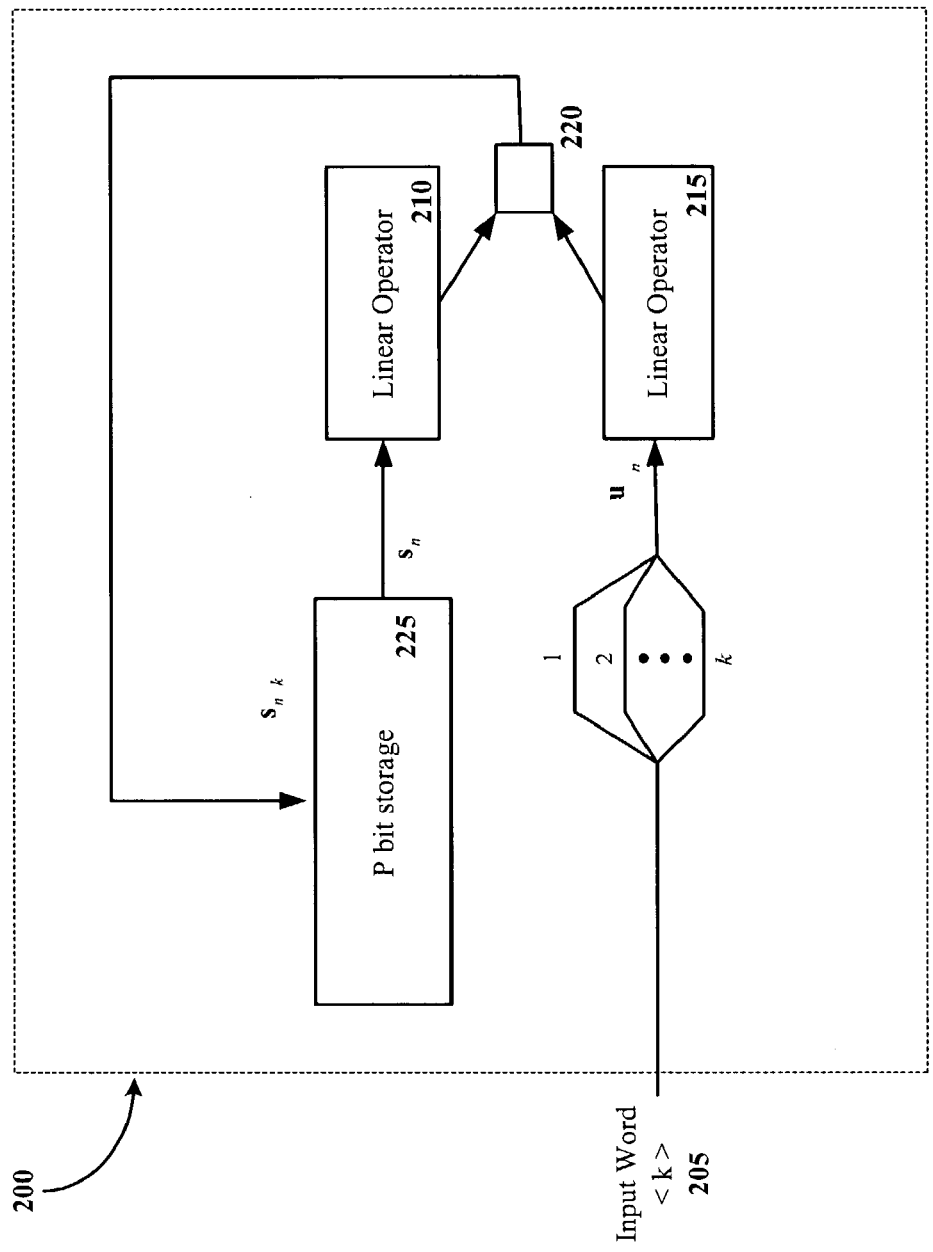
FIG. 2 is an illustration of a error word generator comprising a first linear operator and a second linear operator according to an embodiment of the invention.

FIG. 1 is an illustration of an error word generator 100 according to an embodiment of the invention. For simplicity of illustration this figure and FIG. 2 show operations being performed by separate components. However, the functions that are illustrated in the figures may be implemented in the form of a series of logic gates, software, or any other format capable of implementing the functions. In the illustration shown in FIG. 1, an input ($u_n$) 105 comprises of k data elements of a data stream, with k data elements arriving in each clock cycle of the error word generator 100 or a data word arriving with k data elements. The value of a previous state is stored in a P-bit storage 125. A linear operator 110 is applied to the input $u_n$ 105 and the previous state $s_n$. The linear operator 110 produces a new state $s_{n+k}$. The state $s_{n+k}$ is then stored in the P-bit storage 125 and is used in calculation of the next state. After processing all data elements of the input data stream, the calculated state equals the error word for the data stream.

FIG. 2 is an illustration of an error word generator 200 according to an embodiment of the invention in which a linear operation comprises applying a first linear operator to a previous state and applying a second linear operator to input data. In the illustration shown in FIG. 2, an input ($u_n$) 205 comprises of k data elements of a data stream, with k data elements arriving in each clock cycle of the error word generator 200 or a data word arriving with k data elements. The value of a previous state is stored in a P-bit storage 225, and a first linear operator 210 is applied to the previous state $s_n$. A second linear operator 215 is applied to the input $u_n$ 205. The result generated by first linear operator 210 and the result generated by second linear operator 215 are combined by operator 220, thereby producing a new state $s_{n+k}$. The state $s^{n+k}$ is stored in the P-bit storage 225 and is used in calculation of the next state. After processing all data elements of the input data stream, the calculated state equals the error word for the data stream.

Figure 3:
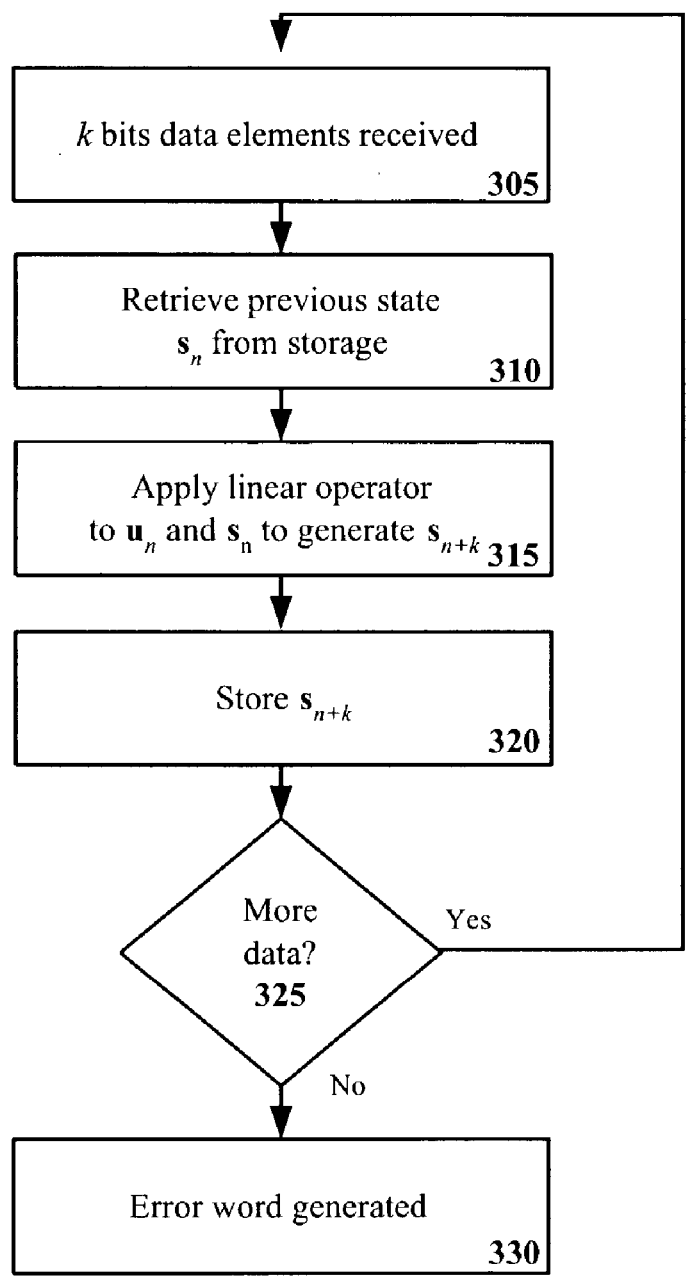
FIG. 3 is a flow chart illustrating an embodiment of the invention applying a linear operator.

FIG. 3 is a flowchart illustrating generation of an error word for a data stream according to an embodiment of the invention. In this illustration, k data elements of a data stream $u_n$ are received 305. A previous state $s_n$ is retrieved from storage 310. A linear operator is applied to the k elements of $u_n$ and to $s_n$ to generate the next state $s_{n+k}$ 315. The next state $s_{n+k}$ is then stored 320. If there are more data elements of the data stream to process 325, the process returns to the reception of k data elements of the data stream 305. If processing of the data stream is completed, the error word for the data stream is equal to the value of the calculated state 330.

Figure 4:
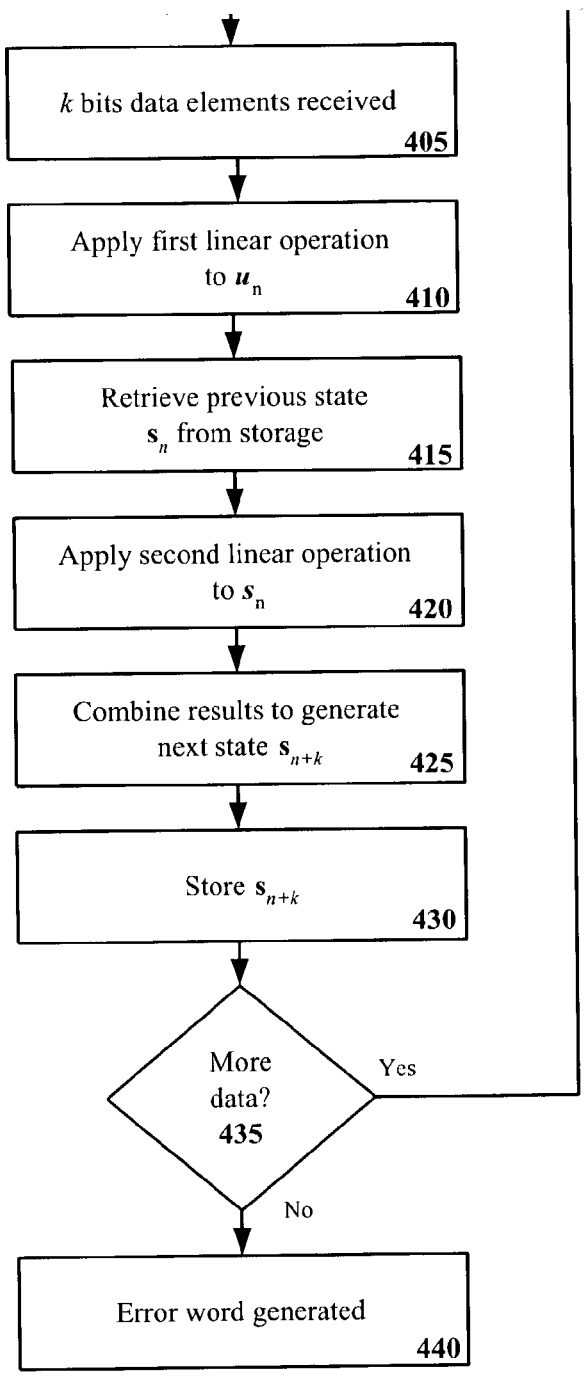
FIG. 4 is a flow chart illustrating an embodiment of the invention applying a first linear operator and a second linear operator.

FIG. 4 is a flowchart illustrating generation of an error word for a data stream according to an embodiment of the invention. In this illustration, k data elements of a data stream $u_n$ are received 405. A first linear operator is applied to the k elements of input $u_n$ 410. The previous state $s_n$ is retrieved from storage 415 and a second linear operator is applied to $s_n$ 420. The results generated by the first linear operator and the second linear operator are combined 425 to generate the next state $s_{n+k}$. The next state $s_{n+k}$ is then stored 430. If there are more data elements of the data stream to process 435, the process returns to the reception of k data elements of the data stream 405. If processing of the data stream is completed, the error word for the data stream is equal to the value of the calculated state 440.

Figure 5:
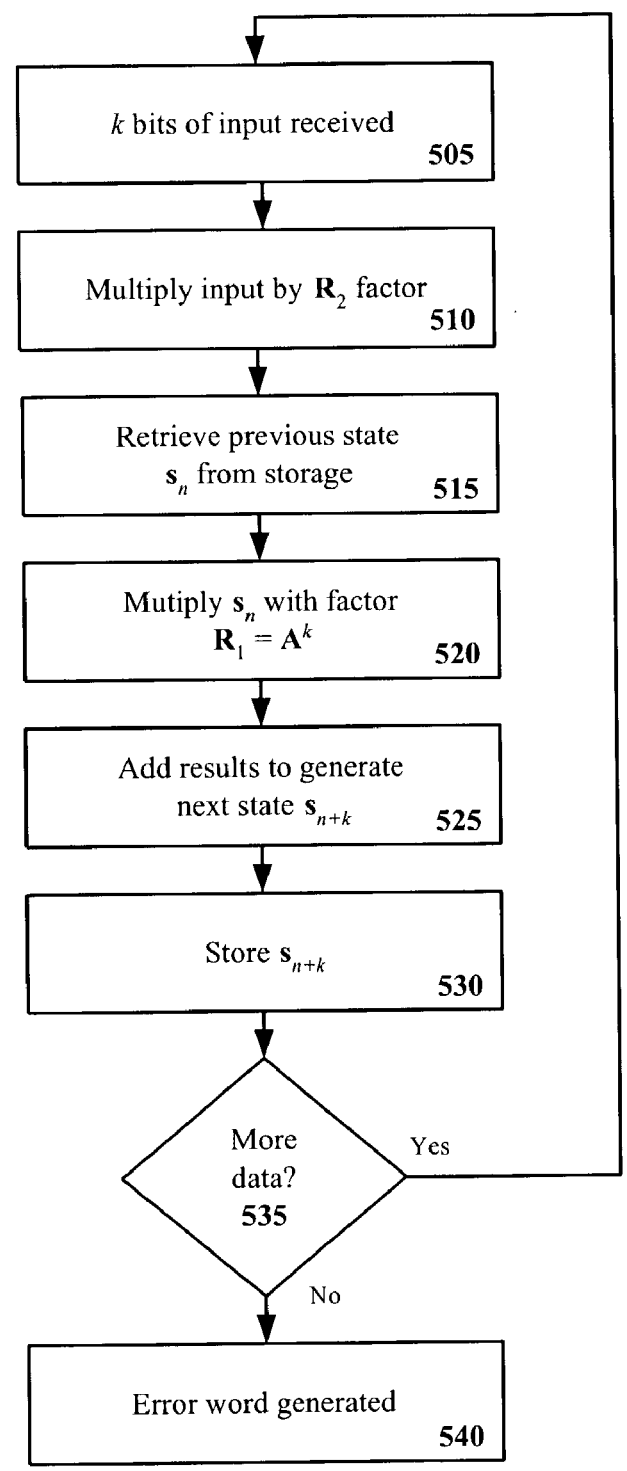
FIG. 5 is a flow chart illustrating an embodiment of the invention including multiplication of input bits by a first factor and multiplication of a previous state by a second factor.

FIG. 5 is a flowchart illustrating generation of an error word for a data stream according to an embodiment of the invention. In this illustration, k data elements of a data stream $u_n$ are received 505. The k elements of input $u_n$ are multiplied by a factor $R_2 = \lfloor A^{k-1}b \ A^{k-2}b \ \Lambda \ Ab \ b \rfloor$ 510. The previous state $s_n$ is retrieved from storage 515 and is multiplied by a factor $R_1 = A^k$ 520. The results of the first multiplication and the second multiplication are added together 525 to generate the next state $s_{n+k}$. The next state $s_{n+k}$ is then stored 530. If there are more bits of the data stream to process 535, the process returns to the reception of k bits of the data stream 505. If processing of the data stream is completed, the error word for the data stream is equal to the value of the calculated state 540.

A particular embodiment of a CRC generator that is capable of processing multiple input bits in every cycle can be demonstrated. In this example, a CRC generator with a generating polynomial of $g(x)=x^{16}+x^{12}+x^5+1$ is implemented, with the order of the generator being 16. The CRC generator is required to process five input bits in each clock cycle. The state-space constants of the generator are:

$$s_n = [S_0 \ S_1 \ \Lambda \ S_{15}]^T \quad (4)$$

$$b = [0001000000100001]^T$$

$$A = \begin{bmatrix} b & I_{15} \\ & 0\Lambda \ 0 \end{bmatrix}$$

In Equation (4), $I_{15}$ represents the identity matrix of dimension 15×15. The state space equation for this specific example can then be written from Equation (3) with k equaling 5:

$$s_{n+5} = A^5 s_n + A^4 b u_n + A^3 b u_{n+1} + A^2 b u_{n+2} + A b u_{n+3} + b u_{n+4} \quad (5)$$

Figure 6:
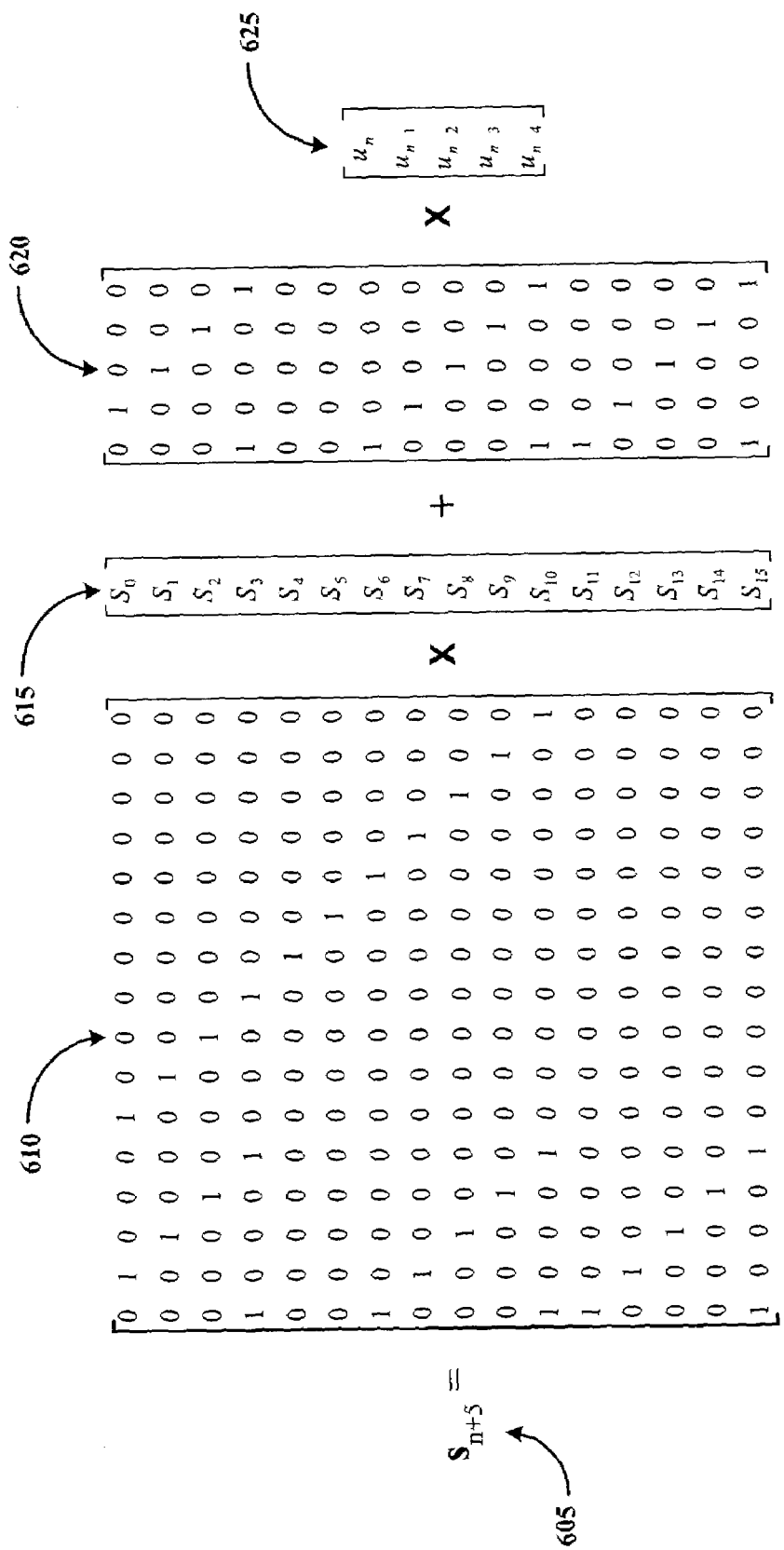
FIG. 6 illustrates an example of an error word calculation under an embodiment of the invention.

Because all of the variables are binary, the operations of Equation (5) will be defined using arithmetic over GF(2). The constants of Equation (5) can be determined using the CRC generator state-space constants. Replacing the constants with the proper values for this example produces the equation as shown in FIG. 6. In this equation, the next state $s_{n+5}$ 605 is equal to the matrix $R_1$ 610 multiplied by the previous state $s_n$ 615 plus the matrix $R_2$ 620 multiplied times the input data 625 (comprising the five elements $u_n$ through $u_{n+4}$).

Because the operations shown in FIG. 5 are contained in GF(2), the multiplication operations can be replaced by logical AND operations and the addition operations can be replaced by logical XOR operations. The CRC generator that is produced provides a processing speed of five times the processing of a conventional LFSR (linear feedback shift register) based generator. This example of a CRC generator can be extended to any number of input bits processed simultaneously. The hardware complexity depends on the density of '1' entries in the matrices of the state equation for the CRC generator.

Figure 7:
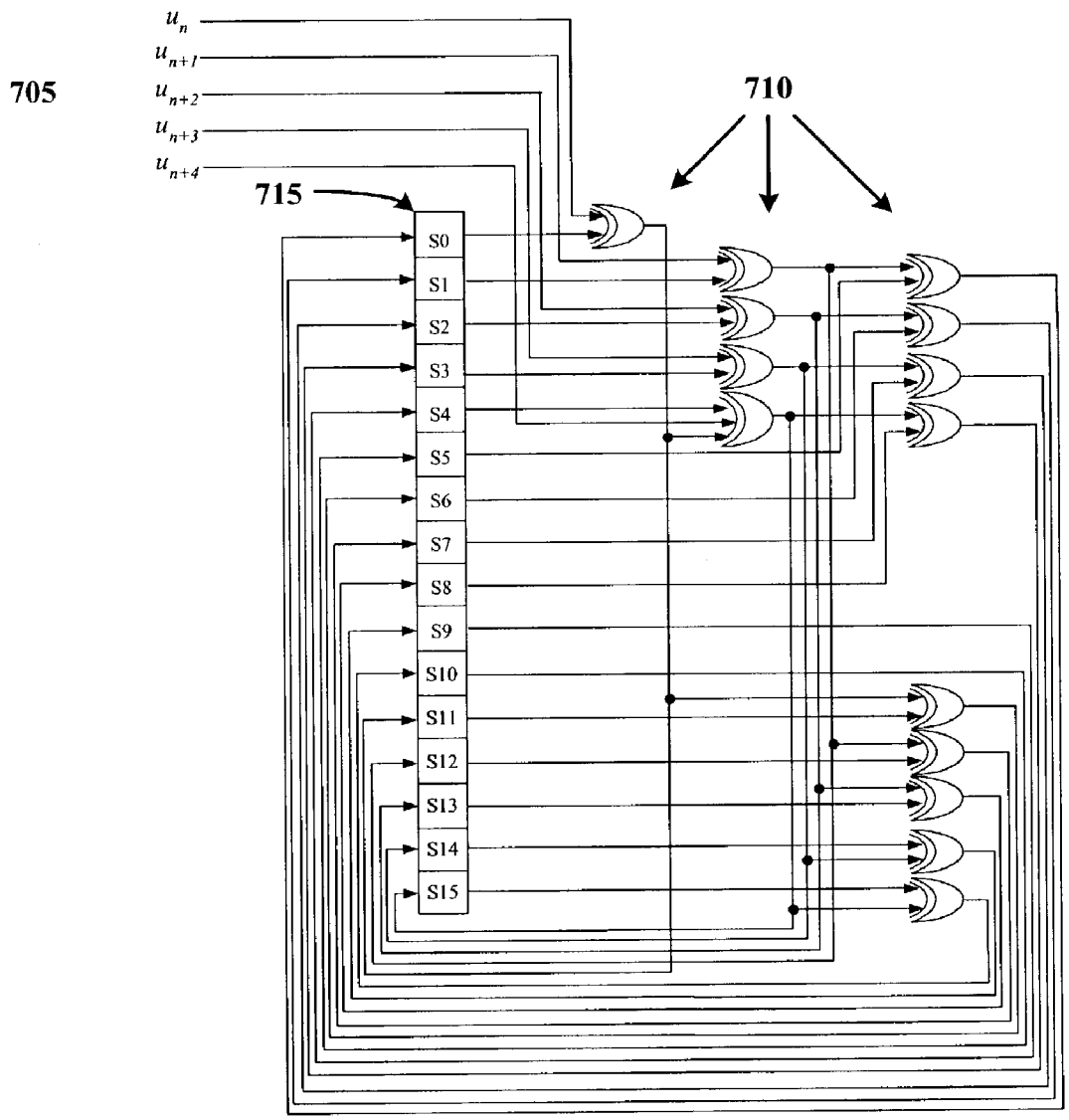
FIG. 7 illustrates an embodiment of a CRC word generator receiving a five-element input.

FIG. 7 is an illustration of a CRC generator that processes five bits of information in each clock cycle according to a particular embodiment of the invention. FIG. 7 shows one implementation, but many other implementations are also possible. In this illustration, a linear operator is applied to elements of input data and a previous state, as shown in FIG. 1. The input 705 comprises five bits of information, shown as $u_n$ through $u_{n+4}$. Because all variables are binary and the mathematics is therefore defined over GF(2), the processing for the error word generator may be implemented using a Boolean function 710, which includes multiple XOR (exclusive OR) logic gates. The CRC generator also includes memory elements S0 through S15 715. The memory elements S0 through S15 715 store the state generated in each iteration or cycle, which state is then updated in the next iteration or cycle through the operation of the Boolean function 710.

Card Architecture

Figure 8:
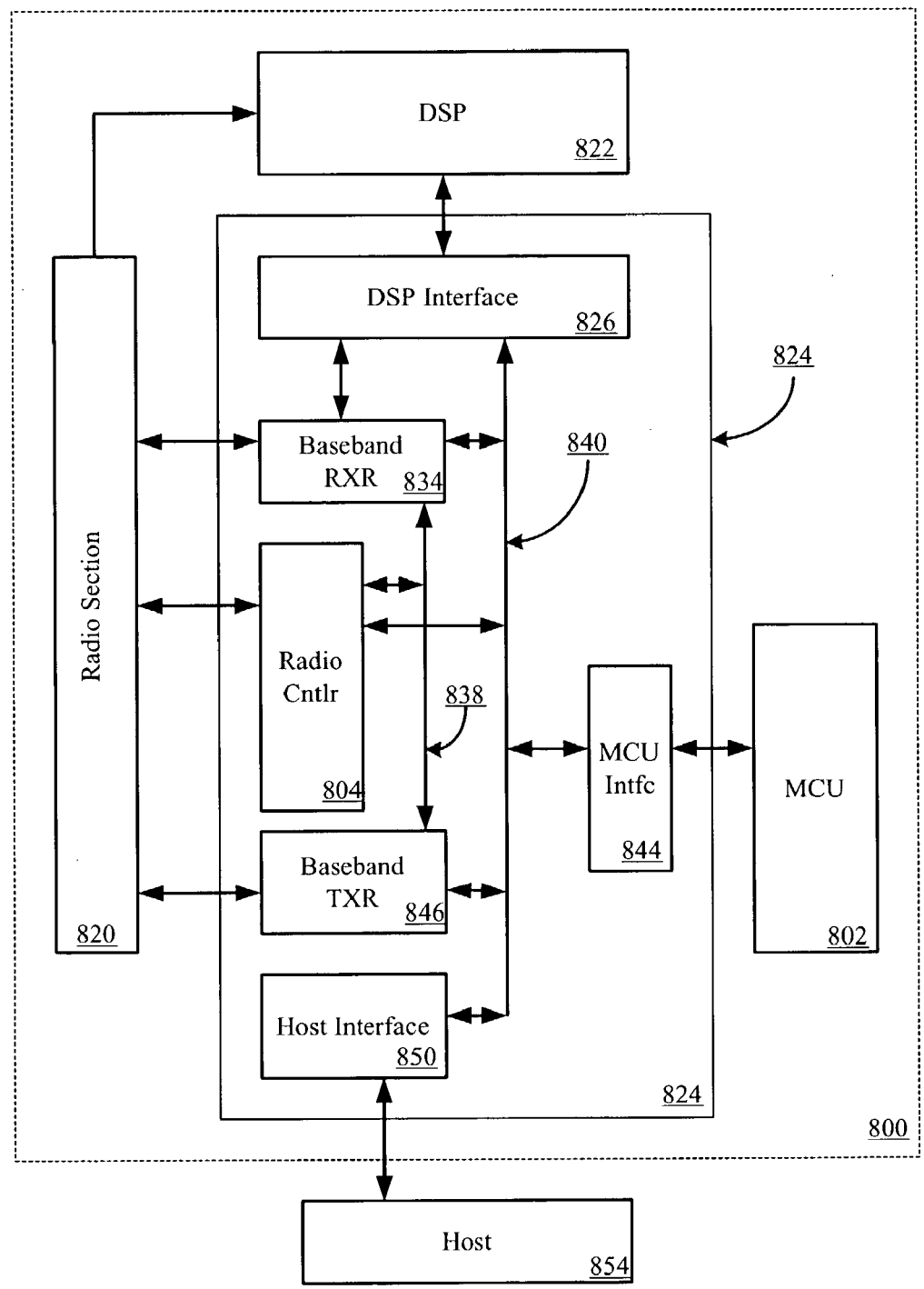
FIG. 8 illustrates a removable device in which an embodiment of the invention may be implemented.

FIG. 8 is a block diagram of a removable device, which may be a computer adapter card 800 such as a PCMCIA (Personal Computer Memory Card International Association) card, SD (Secure Digital) card, MultiMediaCard or USB (Universal Serial Bus) device, in which embodiments of the invention can be implemented. The card 800 is coupled with a host 854 at a port or slot. The host system can be a mobile computer (for example a laptop, notebook, or tablet PC), a desktop computer, a hand-held device (for example palmtops, PDAs, cellular phones, digital cameras), or any other data source or sink including other computers, computer peripherals, and other electronic products.

The card 800 includes a high-layer controller or master control unit (MCU) 802 to perform higher layer processing, such as layer-2, layer-3, and layer-4 processing. The MCU 802 is coupled through an MCU interface 844 to a physical layer processor, such as an ASIC (Application Specific Integrated Circuit) 824, to perform lower layer processing, such as layer-0 and layer-1 processing. A radio section 820 is coupled to the ASIC 824 through a baseband receiver 834, a baseband transmitter or digital modulator 834, and a radio controller 804. A DSP (digital signal processor) 822 is coupled to the ASIC 824 through a DSP interface 826 and to the radio section 820 to process data packets received and transmitted through the radio section 820. As one example, on an uplink the MCU 802 can provide layer-2 format data to the ASIC 824 via the MCU interface 844. The ASIC 824 processes the data to generate a modulated transmit signal that is provided to the radio section 820.

The DSP interface 826 is included in the ASIC 824 to interface data, interrupts, and control signals between the DSP 824 and the ASIC 826, the baseband receiver 834, and the baseband transmitter 846. A radio controller line 838 conveys radio control signals within the ASIC 824. An MCU line 840 conveys controls and data from the MCU 802 within the ASIC 824. The radio controller 804 controls the components within the radio section 820. The radio controller 804 contains an instruction execution unit and controls power and timing for components of the radio. The ASIC 824 also includes a PCMCIA or other type of host interface 850 to provide an interface with the PCMCIA port or other port or slot of the host 854.

In the card 800 shown in FIG. 8, the ASIC 824, the radio section 820, and the DSP 822 each reside on separate chips or modules, although this is not required. In an alternate embodiment any one or more, or all, of such items can be combined on a common chip or module. In addition, while the interfaces and most registers described above are shown as residing on the ASIC, any one or more of these interfaces and memories can reside on one of the other chips or on an additional chip. In yet another embodiment of the invention any portion of the MCU, the ASIC, the DSP, or the radio can be integrated with the host system or implemented in software by executing instructions within a processor of the card, the host or an auxiliary system.

General Matters

The present invention can be implemented in an i-BURST™ personal broadband access system. i-BURST™ is a trademark of ArrayComm, Inc. of San Jose, Calif. The i-BURST™ personal broadband access system provides a high-speed, wireless connection, for example to the Internet, for many wireless devices, such as portable computer systems (for example laptops), handheld devices (for example palmtops), digital cameras, game consoles, Internet appliances, etc. The i-BURST™ personal broadband access system provides speeds of more than 1 Mbps per user and up to 40 Mbps at any location, freedom to move, and an always-on connection.

In addition to i-BURST™ systems, embodiments of the present invention can be implemented in, low-mobility cellular and hot spot wireless communications systems. The present invention, while described in the context of i-BURST™ protocols is in no way restricted to using the i-BURST™ air interface or to TDMA systems, but may be utilized as part of any communication receiver, including CDMA systems using the IS-95 or WCDMA air interface, the GSM (Global System Mobile) air interface, the PHS (Personal Handyphone System defined by the Association of Radio Industries and Businesses ARIB, Japan) interface, IEEE 802.11, and WIFI, and also for wireless local loop (WLL) systems.

In the description above, for the purposes of explanation, numerous specific details are set forth in order to provide a thorough understanding of the present invention. It will be apparent, however, to one skilled in the art that the present invention may be practiced without some of these specific details. In other instances, well-known circuits, structures, devices, and techniques have been shown in block diagram form or without detail in order not to obscure the understanding of this description.

The present invention includes various steps. The steps of the present invention may be performed by hardware components or may be embodied in machine-executable instructions, which may be used to cause a general-purpose or special-purpose processor or logic circuits programmed with the instructions to perform the steps. Alternatively, the steps may be performed by a combination of hardware and software. The steps have been described as being performed by an adapter card of a user terminal. However, many of the steps described as being performed by a user terminal may be performed by a base station and vice versa. Furthermore, the invention is equally applicable to systems in which terminals communicate with each other without either one being designated as a base station, a user terminal, a remote terminal or a subscriber station. Thus, the present invention is equally applicable and useful in a peer-to-peer wireless network of communications devices using spatial processing. These devices may be cellular phones, PDA's, laptop computers, or any other wireless devices. Generally, since both the base stations and the terminals use radio waves, these communications devices of wireless communications networks may be generally referred to as radios.

The present invention may be provided as a computer program product, which may include a machine-readable medium having stored thereon instructions, which may be used to program a computer (or other electronic devices) to perform a process according to the present invention. The machine-readable medium may include, but is not limited to, floppy diskettes, optical disks, CD-ROMs, and magneto-optical disks, ROMs, RAMs, EPROMs, EEPROMs, magnet or optical cards, flash memory, or other type of media/ machine-readable medium suitable for storing electronic instructions. Moreover, the present invention may also be downloaded as a computer program product, wherein the program may be transferred from a remote computer to a requesting computer by way of data signals embodied in a carrier wave or other propagation medium via a communication link (e.g., a modem or network connection).

Many of the methods are described in their most basic form, but steps can be added to or deleted from any of the methods and information can be added or subtracted from any of the described messages without departing from the basic scope of the present invention. It will be apparent to those skilled in the art that many further modifications and adaptations can be made. The particular embodiments are not provided to limit the invention but to illustrate it. The scope of the present invention is not to be determined by the specific examples provided above but only by the claims below.

It should also be appreciated that reference throughout this specification to "one embodiment" or "an embodiment" means that a particular feature may be included in the practice of the invention. Similarly, it should be appreciated that in the foregoing description of exemplary embodiments of the invention, various features of the invention are sometimes grouped together in a single embodiment, Figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

What is claimed is:

1. A method comprising:
receiving a plurality of data elements of a data stream; and
updating an error word for the data stream by processing the plurality of data elements in a single iteration, updating the error word comprising performing a linear operation on the plurality of data elements and a previous value of the error word;
wherein performing the linear operation comprises applying a first linear operator to the previous value of the error word and applying a second linear operator to the plurality of data elements, and wherein applying the first linear operator comprises multiplying the previous value of the error word by a first matrix constant $R_1$ equal to $A^k$, where A is a state transition matrix for a linear feedback shift register and k is the number of data elements received.

2. The method of claim 1, wherein k is equal to any number of data elements greater than one.

3. The method of claim 1, further comprising combining the result of the first linear operator with the result of the second linear operator to produce the updated error word.

4. The method of claim 1, wherein the plurality of data elements are received in parallel.

5. The method of claim 4, wherein the data elements are processed without conversion of the data elements from parallel to serial.

6. The method of claim 1, wherein the error word is a cyclic redundancy check (CRC) word.

7. A method comprising:
receiving a plurality of data elements of a data stream; and
updating an error word for the data stream by processing the plurality of data elements in a single iteration, updating the error word comprising performing a linear operation on the plurality of data elements and a previous value of the error word;
wherein performing the linear operation comprises applying a first linear operator to the previous value of the error word and applying a second linear operator to the plurality of data elements, wherein applying the second linear operator comprises multiplying the plurality of data elements by a second matrix constant $R_2$ equal to:

$R_2 = [A^{k-1}b \ A^{k-2}b \ \ldots \ Ab \ b]$ where b is an input matrix for the linear feedback shift register.

8. The method of claim 7, further comprising combining the result of the first linear operator with the result of the second linear operator to produce the updated error word.

9. The method of claim 7, wherein the plurality of data elements are received in parallel.

10. The method of claim 9, wherein the data elements are processed without conversion of the data elements from parallel to serial.

11. The method of claim 7, wherein the error word is a cyclic redundancy check (CRC) word.

12. A method comprising:
receiving a data stream;
processing a plurality of elements of the data stream in each of a plurality of iterations, processing the plurality of data elements comprising performing a linear operation on the plurality of data elements and a previous value of the error word, wherein performing the linear operation comprises applying a first linear operator to the previous value of the error word and applying a second linear operator to the plurality of data elements; and
producing an error word for the data stream based on the processing of the elements of the data stream; wherein applying the first linear operator comprises multiplying the previous interim result by a first matrix constant $R_1$ equal to $A^k$, where A is a state transition matrix for a linear feedback shift register and k is the number of data elements received.

13. The method of claim 12, wherein k is an arbitrary number of data elements.

14. The method of claim 12, further comprising combining the result of the first linear operator with the result of the second linear operator to produce an interim result.

15. The method of claim 12, wherein the plurality of data elements are received in parallel.

16. The method of claim 15, wherein the data elements are processed without conversion of the data elements from parallel to serial.

17. The method of claim 12, wherein the error word is a cyclic redundancy check (CRC) word.

18. A method comprising:
receiving a data stream;
processing a plurality of elements of the data stream in each of a plurality of iterations, processing the plurality of data elements comprising performing a linear operation on the plurality of data elements and a previous value of the error word, wherein performing the linear operation comprises applying a first linear operator to the previous value of the error word and applying a second linear operator to the plurality of data elements; and
producing an error word for the data stream based on the processing of the elements of the data stream;
wherein applying the second linear operator comprises multiplying the plurality of data elements by a second matrix constant $R_2$ equal to:

$R_2 = [A^{k-1}b \ A^{k-2}b \ \ldots \ Ab \ b]$ where b is an input matrix for the linear feedback shift register.

19. The method of claim 18, further comprising combining the result of the first linear operator with the result of the second linear operator to produce an interim result.

20. The method of claim 18, wherein the plurality of data elements are received in parallel.

21. The method of claim 20, wherein the data elements are processed without conversion of the data elements from parallel to serial.

22. The method of claim 18, wherein the error word is a cyclic redundancy check (CRC) word.

23. An error word generator comprising:
an input to receive a data stream; and
an operator to process a plurality of data elements in a single clock cycle, the operator to perform a first linear operation on the plurality of data elements and a second linear operation on a previous interim result;
wherein the first linear operation comprises multiplying the previous interim result by a first matrix constant $R_1$ to produce a first result, and wherein the first matrix constant $R_1$ is equal to $A^k$, where A is a state transition matrix for a linear feedback shift register and k is the number of data elements received.

24. The error word generator of claim 23, wherein k is equal to any number of data elements greater than one.

25. The error word generator of claim 23, wherein the operator is to combine the result of the first linear operation with the result of the second linear operation to produce an interim result.

26. The error word generator of claim 23, wherein the plurality of data elements are received in parallel.

27. The error word generator of claim 26, wherein the data elements are processed without conversion of the data elements from parallel to serial.

28. The error word generator of claim 23, wherein the error word is a cyclic redundancy check (CRC) word.

29. An error word generator comprising:
   an input to receive a data stream; and
   an operator to process a plurality of data elements in a single clock cycle, the operator to perform a first linear operation on the plurality of data elements and a second linear operation on a previous interim result;
   wherein the second linear operation comprises multiplying the plurality of data elements by a second matrix constant $R_2$ to produce a second result, the second matrix constant $R_2$ being equal to:

$R_2 = [A^{k-1}b \ A^{k-2}b \ \ldots \ Ab \ b]$ where b is an input matrix for the linear feedback shift register.

30. The error word generator of claim 29, wherein the operator is to combine the result of the first linear operation with the result of the second linear operation to produce an interim result.

31. The error word generator of claim 29, wherein the plurality of data elements are received in parallel.

32. The error word generator of claim 31, wherein the data elements are processed without conversion of the data elements from parallel to serial.

33. The error word generator of claim 29, wherein the error word is a cyclic redundancy check (CRC) word.

34. A method of producing an error word for a data stream comprising:
   receiving a data stream, k data elements of the data stream being received for each of a plurality of iterations, k being greater than or equal to two;
   producing a new interim result in each of the plurality of iterations, the new interim result being based on the plurality of data elements and a previous interim result, producing the interim result comprising applying a first linear operator to the k data elements and applying a second linear operator to the previous interim result; and
   storing the new interim result from each iteration for use in a following iteration;
   wherein applying the first linear operator comprises multiplying the previous interim result by a first matrix constant $R_1$ equal to $A^k$, where A is a state transition matrix for a linear feedback shift register.

35. The method of claim 34, wherein producing the interim result further comprises combining the result of the first linear operator with the result of the second linear operator to produce the interim result.

36. The method of claim 34, wherein the k data elements are received in parallel.

37. The method of claim 36, wherein the k data elements are processed without conversion of the data elements from parallel to serial.

38. The method of claim 34, wherein the error word is a cyclic redundancy check (CRC) word.

39. A method of producing an error word for a data stream comprising:
   receiving a data stream, k data elements of the data stream being received for each of a plurality of iterations, k being greater than or equal to two;
   producing a new interim result in each of the plurality of iterations, the new interim result being based on the plurality of data elements and a previous interim result, producing the interim result comprising applying a first linear operator to the k data elements and applying a second linear operator to the previous interim result; and
   storing the new interim result from each iteration for use in a following iteration;
   wherein applying the second linear operator comprises multiplying the k data elements by a second matrix constant $R_2$ equal to:

$R_2 = [A^{k-1}b \ A^{k-2}b \ \ldots \ Ab \ b]$ where b is an input matrix for the linear feedback shift register.

40. The method of claim 39, wherein producing the interim result further comprises combining the result of the first linear operator with the result of the second linear operator to produce the interim result.

41. The method of claim 39, wherein the k data elements are received in parallel.

42. The method of claim 41, wherein the k data elements are processed without conversion of the data elements from parallel to serial.

43. The method of claim 39, wherein the error word is a cyclic redundancy check (CRC) word.

44. An interchangeable computer adapter card comprising:
   a master control unit to control operations performed on the card;
   a radio section to transmit and receive radio signals to and from the card;
   a physical layer processor comprising an error word generator, the error word generator comprising:
      an input to receive a data stream, and
      an operator to process a plurality of data elements in a single clock cycle, the operator to perform a first linear operation on the plurality of data elements and a second linear operation on a previous interim result;
   wherein the first linear operation comprises multiplying the previous interim result by a first matrix constant $R_1$ to produce a first result, the first matrix constant $R_1$ being equal to $A^k$, where A is a state transition matrix for a linear feedback shift register and k is the number of data elements received.

45. The adaptor card of claim 44, wherein k is an arbitrary number of data elements greater than or equal to two.

46. The adapter card of claim 44, wherein the operator is to combine the result of the first linear operation with the result of the second linear operation to produce an interim result.

47. The adapter card of claim 44, wherein the plurality of data elements are received in parallel.

48. The adapter card of claim 47, wherein the data elements are processed without conversion of the data elements from parallel to serial.

49. The adapter card of claim 44, wherein the error word is a cyclic redundancy check (CRC) word.

50. An interchangeable computer adapter card comprising:
- a master control unit to control operations performed on the card;
- a radio section to transmit and receive radio signals to and from the card;
- a physical layer processor comprising an error word generator, the error word generator comprising:
    - an input to receive a data stream, and
    - an operator to process a plurality of data elements in a single clock cycle, the operator to perform a first linear operation on the plurality of data elements and a second linear operation on a previous interim result;
- wherein the second linear operation comprises multiplying the plurality of data elements by a second matrix constant $R_2$ to produce a second result, the second matrix constant $R_2$ being equal to:

$$R_2=[A^{k-1}b\ A^{k-2}b\ \ldots\ Ab\ b]$$

where b is an input matrix for the linear feedback shift register.

51. The adapter card of claim 50, wherein the operator is to combine the result of the first linear operation with the result of the second linear operation to produce an interim result.

52. The adapter card of claim 50, wherein the plurality of data elements are received in parallel.

53. The adapter card of claim 52, wherein the data elements are processed without conversion of the data elements from parallel to serial.

54. The adapter card of claim 50, wherein the error word is a cyclic redundancy check (CRC) word.

* * * * *